United States Patent [19]

Yamashita

[11] 4,101,848

[45] Jul. 18, 1978

[54] OSCILLATOR

[75] Inventor: Shiro Yamashita, Tokyo, Japan

[73] Assignee: Kabushiki Kaisha Daini Seikosha, Japan

[21] Appl. No.: 734,466

[22] Filed: Oct. 21, 1976

[30] Foreign Application Priority Data

Oct. 21, 1975 [JP] Japan .................................. 50/126794

[51] Int. Cl.² .............................................. H03B 5/36
[52] U.S. Cl. ................................ 331/116 R; 361/290; 361/293
[58] Field of Search .................... 331/116 R; 317/256, 317/253; 58/23 R, 23 A, 23 AC; 361/290, 298

[56] References Cited

U.S. PATENT DOCUMENTS

| | | | |
|---|---|---|---|
| 3,289,055 | 11/1966 | Aizawa et al. .................... | 331/116 R |
| 3,659,165 | 4/1972 | Dome ................................ | 331/116 R |
| 3,838,566 | 10/1974 | O'Connor ........................ | 331/116 R |
| 3,878,408 | 4/1975 | Nemoto ........................... | 331/116 R |
| 3,909,638 | 9/1975 | Teraishi et al. .................... | 58/23 A |

*Primary Examiner*—John Kominski
*Attorney, Agent, or Firm*—Robert E. Burns; Emmanuel J. Lobato; Bruce L. Adams

[57] ABSTRACT

An oscillator for producing an output signal having a predetermined frequency for use in an electronic timepiece. The oscillator comprises a miniature crystal vibrator having a high resonant frequency, a case housing the crystal vibrator, an integrated circuit comprising an oscillator circuit with the crystal vibrator, and a trimmer condenser for adjusting the high resonant frequency. The trimmer condenser is formed on an external recess portion of said case, and is connected with the crystal vibrator and integrated circuit by a circuit having low stray capacitances. The oscillator is therefor highly insensitive to external electric fields.

4 Claims, 5 Drawing Figures

OSCILLATOR

BACKGROUND OF THE INVENTION

This invention relates to an oscillator having a crystal vibrator such as quartz crystal vibrator and more particularly it relates to an oscillator overcoming the problem of the package.

Generally, an oscillator is disposed in the inner portion of an electronic apparatus such as an electronic timepiece or communication apparatus. And most oscillators are disposed on a circuit board carrying an electronic circuit of the electronic apparatus. However, a crystal vibrator used in the oscillating circuit of the oscillator is disposed in the case to avoid external noise and is connected to the circuit board through a lead wire.

DESCRIPTION OF THE PREFERRED EMBODIMENT

Figure 1:
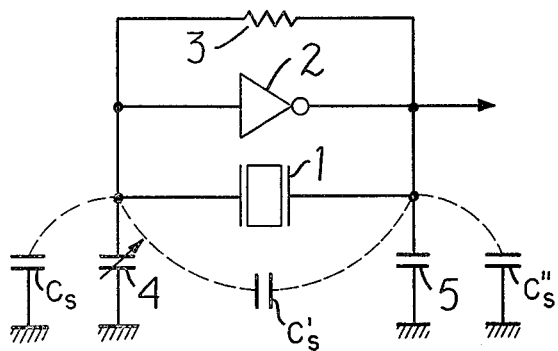
FIG. 1 is a circuit diagram showing an oscillating circuit using a quartz crystal vibrator as a crystal vibrator.

The oscillating circuit using the crystal vibrator, for example, an AT cut thickness shear mode quartz crystal vibrator, comprises the quartz crystal vibrator 1, the inverter 2, the feedback resistor 3, the trimmer condenser 4 for adjusting for oscillating frequency and the condenser 5 for compensating the temperature change.

Figure 2:
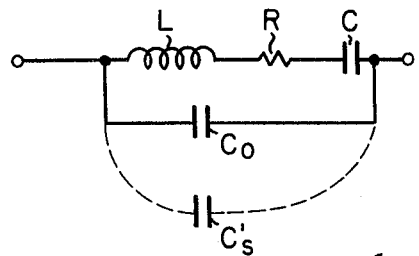
FIG. 2 is the equivalent electric circuit of the quartz crystal vibrator of the oscillating circuit shown in FIG. 1.

The equivalent electric circuit of the quartz crystal vibrator comprises the series circuit including L, R and C, and Co connected in parallel with the series circuit as shown in FIG. 2. Herein, L, R and C respectively are the inductance, the resistance and the capacitance determining the dynamic impedance when the quartz crystal vibrator oscillates.

The equivalent electric circuit of the quartz crystal vibrator as described above is accurate. However, in practice, the stray capacitance Cs' as shown in FIG. 1 and FIG. 2 is in parallel with Co due to the capacitive effect of the vibrator lead wire coupling with other conductive structure. Other components also exhibit stray capacitances Cs and Cs".

Referring now to an electronic wrist watch, the above mentioned stray capacitances Cs, Cs' and Cs" respectively increase by assembling the electronic watch structure together with the oscillator and the other components.

In the absence of defects the oscillator will oscillate normally before assembling it on the watch circuit board.

Especially, in a small quartz crystal vibrator having a relatively high natural frequency and low electrostatic capacitance Co, as variations of the oscillating condition due to variations of the stray capacitances Cs, Cs' and Cs" occur, the oscillating frequency varies broadly, is in an unstable state and often will not occur.

Assembling the above mentioned oscillating circuit in a small electronic apparatus such as an electronic timepiece changes stray capacitances of oscillating circuit and the oscillating frequency adjusted on the circuit board before assembling the oscillator varies broadly even if the oscillator does not stop oscillating. Accordingly, since the oscillator must be adjusted again to set its oscillating frequency, and this raises the problem of package design.

In a small electronic apparatus such as a portable electronic wrist watch, the problem of the package design is great since the circuit board is packaged in a narrow space.

The object of this invention is to provide an oscillator eliminating the above mentioned packaging problem and being easily adjustable to set the oscillating frequency easy and being stable so as to obtain a stable oscillating frequency.

Figure 3:
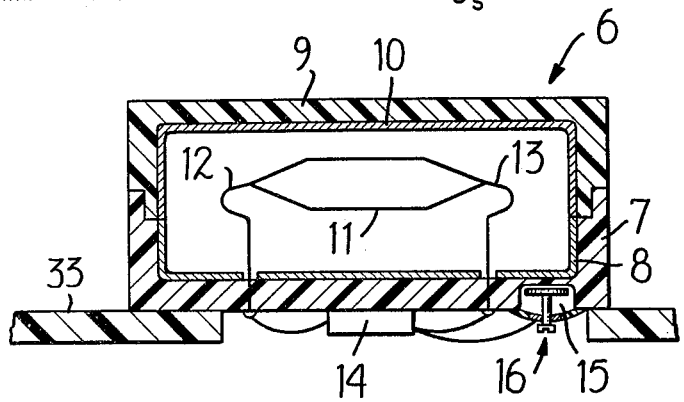
FIG. 3 is a side sectional view of an oscillator according to this invention.

Referring now to FIG. 3 showing an embodiment of the oscillator according to this invention, the reference numeral 6 designates a case which comprises the lower case portion 7 made of an insulating material such as a ceramic having a metalic layer 8 formed by non-electrolytic plating the inner surface of the lower case portion 7, and the upper case portion 9 having the metalic layer 10 on the inner surface and fixed to the lower case 7 and hermetically sealed.

The AT cut quartz crystal vibrator 11 disposed in the inner portion of the case 6 is supported by a pair of the supporting members 12 and 13 extending from the case.

And also, the electronic component 14 such as an Integrated circuit is disposed on the lower case portion 7. The electronic component 14 is connected electrically to the supporting members 12 and 13.

Figure 4:
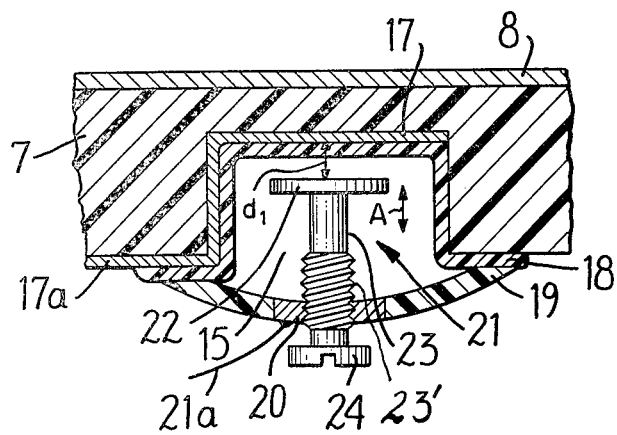
FIG. 4 is a greatly enlarged sectional view of an embodiment of a trimmer condenser for adjusting an oscillating frequency disposed in the case of the crystal vibrator.

On the other hand, the lower case portion 7 of the case 6 has the recess 15 as shown in FIG. 4 and the trimmer condenser 16 for adjusting the oscillating frequency is formed in the recess 15.

The trimmer condenser 16 comprises the electrode 17 which is an evaporation deposited metallic membrane formed on the bottom surface of the recess 15, the insulating layer 18 formed on the electrode 17, the lid portion 19 housing the recess 15, and the rotor-electrode 21 through the screw threaded portion 20 in the lid portion 19. The electrode 17 is connected electrically to the supporting members 13 of the quartz crystal vibrator 11 and to the electronic component 14. A lead terminal 17a is formed by an extension of the electrode 17 and 13 disposed directly on a surface of the case.

The rotor-electrode 21 comprises the circular shaped electrode 22 inserted in the recess 15, the stem 23 having the screw portion 23' on the surface thereof and the top or head portion 24 disposed on the outer side of the lid portion 19 and at one end of the stem 23. The rotor electrode 21 rotates and moves in the direction of arrow A upon rotation of the top portion 24 whereby the width $d_1$ between the electrode portion 22 and the electrode 17 formed in the bottom portion of the recess 15 is changed.

The rotor electrode 21 is connected electrically to the electronic component 14 through the lead portion 21a formed on the surface of the lid portion 19. The trimmer condenser 16 is able to change the electrostatic capacitance by adjusting the width $d_1$ between the rotor electrode 21 and the electrode 17.

Figure 5:
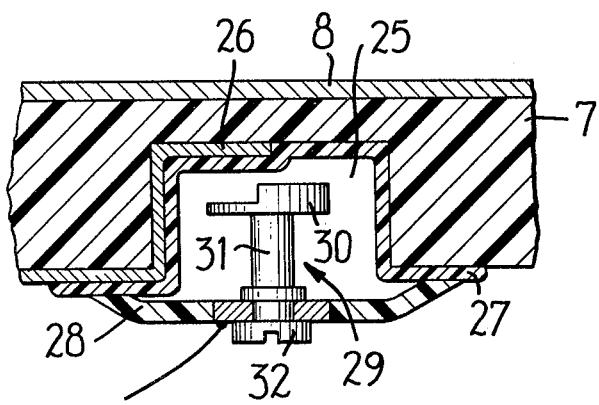
FIG. 5 is a side sectional view showing another embodiment of the trimmer condenser.

FIG. 5 shows another embodiment of the trimmer condenser.

The electrode 26 is formed in half of the bottom surface area of the recess 25 of the lower case portion 7. And further, the insulating layer 27 is formed on the electrode 26 and the bottom surface area of the recess. The recess 25 has the lid portion 28 and the rotor electrode 29 is mounted on the lid portion 28 to be rotatable.

The rotor electrode 29 comprises the electrode portion 30 which has a broad portion and a narrow portion defining the gap between it and the bottom surface of the recess 25, the stem 31 extending from the electrode portion 30 and attached to the lid portion 28 through a hole, and the top or head portion 32 formed at one end.

In the trimmer condenser, the rotor electrode 29 is rotated by the top portion 32 whereby the area of the electrode 26 in the bottom surface of the recess 25 opposite the thick portion of the electrode portion 30 of the rotor electrode 29 is varied. Accordingly, the static capacitance of the trimmer condenser is adjusted.

The case having the above mentioned trimmer condenser 16 mounts on the circuit board 33 forming the electronic circuit of the electronic apparatus such as the portable electronic timepiece, the remaining structure of which is not shown in Figure.

Thus, the stray capacitance of the oscillating circuit portion is reduced and further it does not vary broadly even if the trimmer condenser 16 is mounted within the narrow space of the small electronic apparatus. And the oscillating circuit portion is able to obtain a stable oscillating frequency so as to maintain a constant oscillating condition since the trimmer condenser 16 is mounted on one part of the case 6 housing the quartz crystal vibrator 11.

Also, the stray capacitance of the oscillating circuit portion is reduce and the oscillating frequency is stable, due to mounting of the electronic component comprising the oscillating circuit on the case 6. And also, the oscillating frequency can be adjusted precisely and easily with one operation if the respective top portions 24 and 32 of the rotor electrodes 21 and 29 are mounted with the recess positioned to permit access thereto when the case 6 is mounted on the circuit board 33 to allow adjustment of the trimmer.

The detailed description of this invention has been made with reference to the embodiments shown in the drawings. However, this invention is not limited to the disclosed embodiments of the drawings. For example, the case may be made of metal. In this case, the recess forming the trimmer condenser would have to be insulated with an insulating material.

And also, the structure of the trimmer condenser in the recess of the case is able to combine the structure of the rotor movable in the upper and lower direction with the structure of the rotor having a variable area of overlap between one electrode and the opposite electrode.

As mentioned above, with the oscillator according to the invention, the stray capacitance of the oscillating circuit portion is able to be reduced and the variation of the stray capacitance due to external noise is able to be reduced by positioning the trimmer condenser for adjusting the oscillating frequency on the case housing the crystal vibrator. Especially, even in the oscillator according to the invention having a relatively high frequency and small crystal vibrator a stable oscillating frequency is able to be obtained. Moreover, the adjustment of the oscillating frequency is able to be made precisely by the above mentioned trimmer condenser.

I claim:

1. An oscillator for developing an oscillatory output signal having a predetermined frequency, for use in an electronic timepiece, comprising: a miniature crystal vibrator element; a case housing said vibrator element with said vibrator element mounted for vibration in said case; an integrated circuit mounted on said case and comprising with said vibrator element an oscillator circuit having a frequency of oscillation determined by said vibrator element; a trimmer capacitor, said case having an exterior surface portion having a recess formed therein with said trimmer capacitor position within said recess; and means having low stray capacitances electrically connecting said vibrator element and said integrated circuit and said trimmer capacitor to define said oscillator circuit with said trimmer capacitor effective to alter the frequency of oscillation of said oscillator circuit, whereby said oscillator circuit is substantially insensitive to external electric fields.

2. An oscillator according to claim 1, wherein said trimmer capacitor includes at least one lead terminal deposited on said case.

3. An oscillator according to claim 1, wherein said trimmer capacitor includes a movable electrode and a stationary electrode comprised of a conductive layer disposed within the recess in said case.

4. An oscillator according to claim 1, wherein said case comprises a ceramic material.

* * * * *